United States Patent
Matsuoka

(10) Patent No.: US 9,360,764 B2
(45) Date of Patent: Jun. 7, 2016

(54) EXPOSURE APPARATUS AND DEVICE MANUFACTURING METHOD

(71) Applicant: CANON KABUSHIKI KAISHA, Tokyo (JP)

(72) Inventor: Yoichi Matsuoka, Shioya-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/552,841

(22) Filed: Nov. 25, 2014

(65) Prior Publication Data

US 2015/0146177 A1   May 28, 2015

(30) Foreign Application Priority Data

Nov. 28, 2013   (JP) .................. 2013-245600

(51) Int. Cl.
  *G03B 27/52* (2006.01)
  *G03B 27/42* (2006.01)
  *G03F 7/20* (2006.01)

(52) U.S. Cl.
  CPC .................. *G03F 7/70341* (2013.01)

(58) Field of Classification Search
  CPC .................. G03F 7/70341; G03F 7/70783
  USPC .................. 355/30, 53, 72
  See application file for complete search history.

(56) References Cited

U.S. PATENT DOCUMENTS

| | | | |
|---|---|---|---|
| 7,081,943 B2 | 7/2006 | Lof et al. | |
| 7,903,233 B2 | 3/2011 | Coon | |
| 8,659,741 B2 | 2/2014 | De Graaf | |
| 8,823,919 B2 * | 9/2014 | Dziomkina et al. | ............ 355/30 |
| 8,860,923 B2 | 10/2014 | Hoogendam et al. | |
| 2004/0165159 A1 | 8/2004 | Lof et al. | |
| 2008/0094590 A1 | 4/2008 | Coon | |

FOREIGN PATENT DOCUMENTS

| | | |
|---|---|---|
| CN | 1612053 A | 5/2005 |
| CN | 101403861 A | 4/2009 |
| JP | 2011109092 A | 6/2011 |

OTHER PUBLICATIONS

Office Action issued in Chinese Appln. No. 201410683379.0 mailed Apr. 1, 2016. English translation provided.

* cited by examiner

*Primary Examiner* — Hung Henry Nguyen

(74) *Attorney, Agent, or Firm* — Rossi, Kimms and McDowell LLP

(57) ABSTRACT

An exposure apparatus includes a measuring member disposed in a substrate stage for holding the substrate, at a side of a surface holding the substrate of a substrate stage, an auxiliary member disposed at a side of the surface of the substrate stage, with a gap with the measuring member, and a sealing member contacting a surface of the auxiliary member, disposed to cover the gap, and for suppressing penetration of the liquid locating on a surface of the measuring member, or the surface of the auxiliary member into the gap, and wherein the sealing member has a shape forming a space where a part of the surface of the measuring member contacts gas, while the liquid is on the surface of the measuring member and the liquid contacts an edge of the sealing member.

8 Claims, 4 Drawing Sheets

EXPOSURE APPARATUS AND DEVICE MANUFACTURING METHOD

BACKGROUND OF THE INVENTION

1. Field of the Invention

The present invention relates to an exposure apparatus and a device manufacturing method.

2. Description of the Related Art

A liquid immersion exposure apparatus is known as an exposure apparatus having a high resolution. The liquid immersion exposure apparatus fills a liquid between a final surface of a projection optical system and a substrate, and projects a pattern of an original on the substrate via the projection optical system and the liquid to expose the substrate. In the liquid immersion exposure apparatus, in a case that a bubble exists in the liquid between the final surface and the substrate, the bubble shields and refracts the exposure light, causing a reduction in a resolution of the pattern. Therefore, the liquid immersion exposure apparatus uses liquid that has undergone deaeration processing. Further, in this liquid immersion exposure apparatus, an auxiliary member is provided on a peripheral part of the substrate and a measuring plate, in order to suppress liquid leakage during the exposure in a peripheral edge of the substrate and during measurements such as focus and alignment. Japanese Patent Application Laid-Open No. 2011-109092 discloses a sealing member that is provided for suppressing liquid leakage into a gap between the auxiliary member and the measuring plate, and has a polymer sealing part and an adhesive layer.

However, the sealing member as described above has a micro gap while contacting with the measuring plate and the auxiliary member. While water-repellency is controlled on the surface of the members such as the measuring plate, the sealing member, and the auxiliary member with which immersion liquid is in contact, gas exists in the micro gap. Therefore, when liquid that has undergone deaeration processing is placed on the sealing member during the measurement at the measuring plate and the like, the liquid dissolves air in the micro gap. When the gas in the micro gap of the sealing member dissolves in the liquid, the gap acquires a negative pressure and the liquid enters the micro gap. Because the liquid that has entered the micro gap stagnates in the micro gap with a force stronger than holding force of the immersion liquid, the liquid may remain in the micro gap, even after the measurement at the measuring plate and the like is completed and immersion liquid moves. Moreover, the immersion liquid is partially drawn by the liquid in the micro gap and the large liquid residue may occur. In particular, in the case where a cross-sectional structure having the micro gap forms a closed space and the liquid covers all of the closed space and in the case where intermolecular forces generated by the liquid that has entered the micro gap is stronger than surface tension of the liquid, liquid film residue covering all of the closed space occurs. The liquid residue causes the reduction of the exposure accuracy on the substrate and the liquid residue pollutes the measuring plate upon drying on the measuring plate, thereby causing the measurement fault.

SUMMARY OF THE INVENTION

The present invention provides, for example, an exposure apparatus which is advantageous in suppression of occurrence of liquid residue on a measuring plate after liquid immersion exposure.

According to an aspect of the present invention, an exposure apparatus for exposing a substrate while liquid is filled between a projection optical system and the substrate, is provided that comprises a measuring member disposed in a substrate stage for holding the substrate, at a side of a surface holding the substrate of the substrate stage; an auxiliary member disposed at a side of the surface of the substrate stage, with a gap with the measuring member; and a sealing member contacting a surface of the auxiliary member, disposed to cover the gap, and for suppressing penetration of the liquid locating on a surface of the measuring member or the surface of the auxiliary member into the gap, wherein the sealing member has a shape forming a space where a part of the surface of the measuring member contacts gas, while the liquid is on the surface of the measuring member and the liquid contacts an edge of the sealing member.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

First Embodiment

Figure 1:
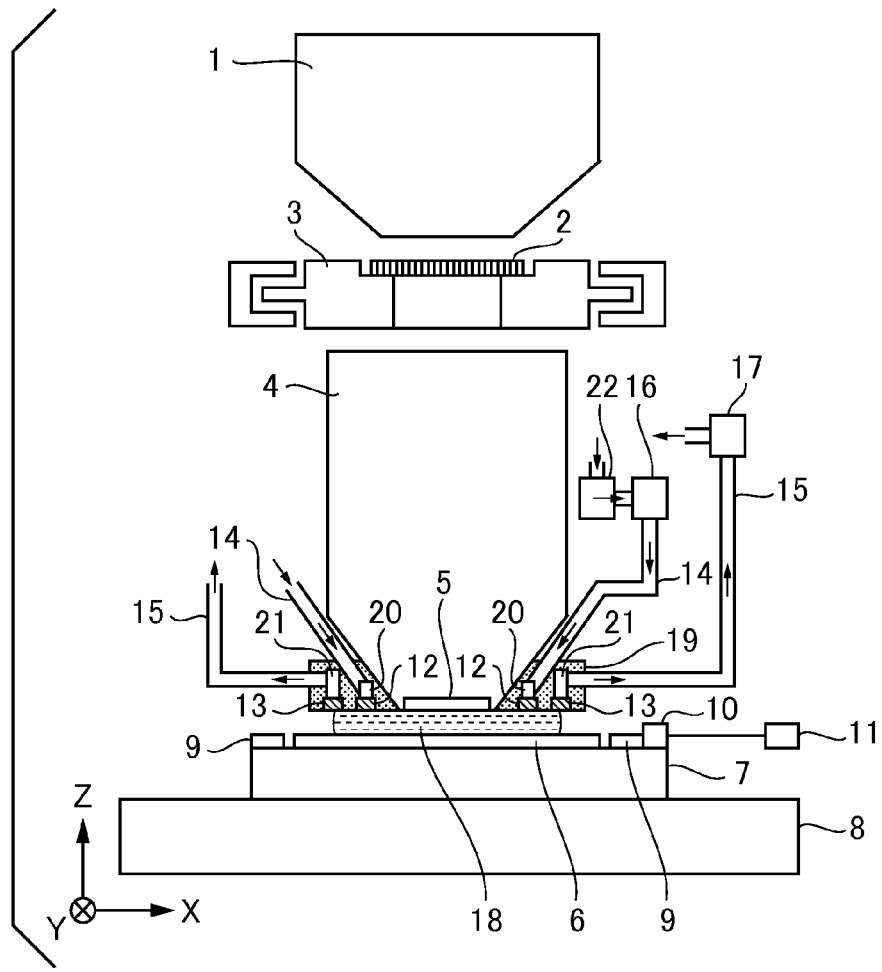
FIG. 1 illustrates a schematic configuration of an exposure apparatus according to one embodiment of the present invention.

Firstly, a configuration of an exposure apparatus according to a first embodiment of the present invention will be described. FIG. 1 is a schematic diagram illustrating a configuration of the exposure apparatus according to the present embodiment. The exposure apparatus is a step-and-scan liquid immersion exposure apparatus used in a manufacturing process of a semiconductor device, which serves as one example. The liquid immersion exposure apparatus exposes a pattern (for example, a circuit pattern) formed on a reticle (original) 2 on a wafer 6 (on a substrate) while supplying liquid (immersion liquid) 18 to a space (liquid immersion area) between a final surface of a projection optical system and the wafer. In the step-and-scan liquid immersion exposure apparatus, a reticle stage (original stage) 3 holding the reticle 2 and a wafer stage (substrate stage) 7 holding the wafer (substrate) 6 move in synchronization with each other. The synchronization results in the entire pattern on the reticle 2, continuously forming an image on the wafer 6 via a projection optical system 4 to expose resist that is applied to the surface of the wafer 6. It is noted that, in FIG. 1, the Y-axis is aligned in a scanning direction of the reticle 2 and the wafer 6 upon exposure in a plane vertical to the Z-axis that is a vertical direction, and the X-axis is positioned in a nonscanning direction orthogonal to the Y-axis. Additionally, in the embodiment, the Z-axis and an optical axis of the projection optical system 4 are parallel. The exposure apparatus is provided with an illumination system 1, the reticle stage 3, the projection optical system 4, the wafer stage 7, and a nozzle 19.

The illumination system 1 includes optical elements, for example, a lens, a mirror, a light integrator, or a diaphragm, and adjusts light emitted from a light source (not illustrated) in a slit shape, and illuminates the predetermined illumination area on the reticle 2 with an exposure light having a uniform distribution of illuminance. In addition to a mercury lamp, for example, a KrF excimer laser, or an ArF excimer or a F2 laser having a short wavelength can be used as the light source.

The reticle stage 3 holds the reticle 2 and is movable in the X and Y-axes directions, and is slightly rotatable in the θZ direction. The reticle stage 3 may perform any driving from uniaxial driving to six-axial driving. The reticle stage 3 is driven by a driving system (not illustrated) such as a linear motor, and the driving is controlled by a controller (not illustrated).

The projection optical system 4 projects a reticle pattern of the reticle 2 on the wafer 6 with a predetermined magnification. The liquid immersion exposure apparatus exposes the wafer 6 while a liquid 18 is filled in a liquid immersion area between a final lens (optical element) 5 located nearest to the wafer 6 in the projection optical system 4 and the wafer 6.

The wafer stage 7 is located on a base 8, holds the wafer 6, and is capable of moving in the X, Y, Z-axes directions and slightly moving in the θX, θY, θZ directions by a driving system (not illustrated) such as a linear motor. Further, an X-direction length measuring mirror 10 is fixed to the wafer stage 7, and reflects and receives light emitted from an X-direction laser interferometer for measuring the position of the wafer stage 7 in the X-axis direction, and measures the position of the wafer stage 7 in the X-axis direction. Similarly, with regard to the Y-direction, a Y-direction length measuring mirror (not illustrated) which is fixed to the wafer stage 7 and a Y-direction laser interferometer (not illustrated) for measuring the position in the Y-axis direction are provided and measure the position of the wafer stage 7. Additionally, a length measuring mirror (not illustrated) is provided in the reticle stage 3, and the position of the reticle stage 3 is measured by a laser interferometer (not illustrated) for measuring the position of the reticle stage 3.

The positions of the reticle stage 3 and the wafer stage 7 are measured in real time and a controller (not illustrated) performs positioning and synchronous controlling of the reticle 2 and the wafer 6 based on the measured values. A driving system is incorporated in the wafer stage 7 for adjusting, changing, or controlling the position in the vertical direction (Z-direction), the rotating direction, and the inclination of the wafer 6. Upon exposure, the wafer stage 7 is controlled by the driving system so as to always align the focal plane of the projection optical system 4 with the exposure area on the wafer 6 with a high accuracy. Here, the position of the exposure surface on the wafer 6 (vertical direction position and inclination) is measured by an optical focus sensor (not illustrated) and provided in the controller.

With reference to the space in the vicinity of the wafer stage 7 and the final lens of the projection optical system 4, a mostly sealed space is formed, and gas that is controlled so as to attain a predetermined temperature and humidity is blown into the space from an air conditioner (not illustrated). Thereby, the space on the periphery of wafer stage 7 and the final lens is maintained at the predetermined temperature. Similarly in the peripheral space of the reticle stage 3, a mostly sealed space is formed and gas that is controlled so as to attain a predetermined temperature and humidity is blown into the space. Accordingly, the peripheral space of the reticle stage 3 is maintained at a predetermined temperature.

A nozzle 19 is provided so as to surround the optical element 5 on the final surface of the projection optical system 4, and has a supply opening 12 for supplying a liquid 18 to the liquid immersion area and a recovery opening 13 for recovering the liquid 18 from the liquid immersion area. The supply opening 12 is provided so as to surround the periphery of the optical element 5 and to face the wafer 6, and the recovery opening 13 is provided so as to surround the optical element 5 and the supply opening 12 and to face the wafer 6. A buffer space 20 is provided above the supply opening 12 so as to spread the liquid 18 that is supplied from a supply tube 14 to the whole circumference of the supply opening 12, and the buffer space 20 is connected to a liquid supply device 16 via the supply tube 14. Further, buffer space 21 is provided on the recovery opening 13 in a manner similar to the supply opening 12, and the buffer space 21 is connected to liquid and gas recovery units 17 via a recovery tube 15.

Here, a mechanism for recovering gas by using the recovery opening 13 will be explained. When the supply of the liquid 18 is started (that is, a state that the liquid immersion area is still not filled with the liquid 18), the recovery opening 13 recovers gas in the liquid immersion area. Subsequently, when the liquid immersion area is filled with the liquid 18, the liquid 18 continues to be supplied from the supply opening 12 and continues to be recovered by the recovery opening 13. Therefore, as shown in FIG. 1, the liquid 18 does not flow out of the wafer stage 7 over the recovery opening 13. According to the configuration, an interface between the liquid 18 and the external gas occurs near the recovery opening 13, and the liquid 18 and gas around the liquid 18 are recovered from the recovery opening 13. Here, in FIG. 1, the supply tube 14 connected to the buffer space 20 and the recovery tube 15 connected to the buffer space 21 are drawn in the same plane (in the ZX plane perpendicular to the wafer 6) for ease of understanding. However, the present invention is not limited to this configuration, and the supply tube 14 and the recovery tube 15 may be located in different planes in the planes perpendicular to the wafer 6.

The liquid recovery device 16 may include, for example, a tank for storing the liquid 18, a pressure transfer unit for carrying the liquid 18, and a flow controller for controlling supply flow quantity of the liquid 18. Preferably, the liquid recovery device 16 further includes a temperature controller for controlling the supply temperature of the liquid 18. The liquid and gas recovery device 17 may include, for example, a tank for separating the liquid 18 and the gas recovered and temporarily storing the liquid 18, a suction unit for suctioning the liquid 18 and the gas, and a flow controller for controlling the recovery flow quantity of the liquid 18 and the gas.

As the liquid 18 for the liquid immersion type exposure apparatus, a liquid substance that is low absorption of exposure light is preferably used. Specifically, for example, pure water, functional water, and fluoride liquid (for example, fluorocarbon) may be employed as the liquid 18. The liquid 18 suppresses the occurrence of bubbles and dissolved gas is sufficiently removed by using a deaeration device 22 in advance so that bubbles are immediately absorbed in the liquid 18 even when the bubbles occur. For example, with much nitrogen and oxygen included in the atmosphere as a target, if equal to more than 80 percent of gas volume dissolvable in the liquid 18 is removed, the occurrence of bubbles can be sufficiently suppressed. For example, a vacuum deaeration device may be employed as the deaeration device 22 for causing the liquid 18 to flow to one side across a gas permeable membrane and for vacuating the other side and discharging the dissolved gas in the liquid 18 in the vacuum via the membrane.

Figure 2:
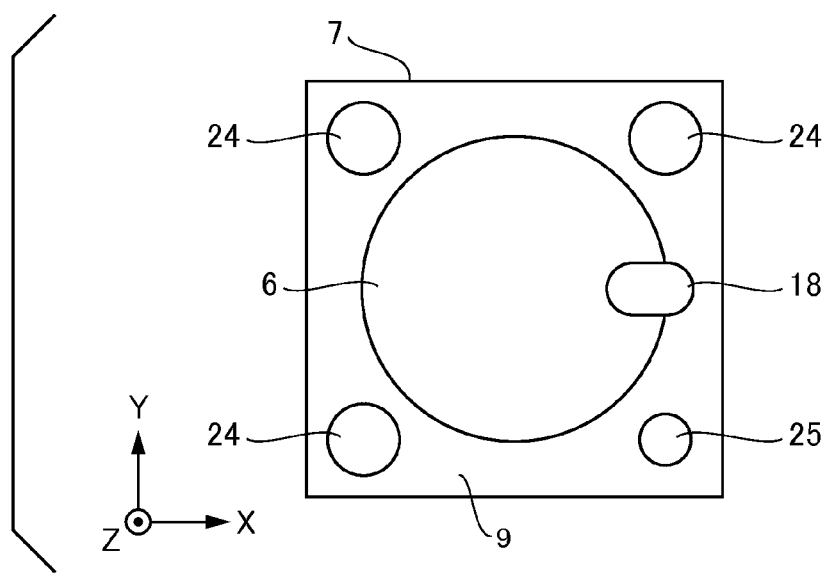
FIG. 2 is a top view of a wafer stage according to one embodiment of the present invention.

FIG. 2 is a plan view of the wafer stage 7 seen from above. An auxiliary member (flat plate) 9 that is substantially in the same plane as that of the wafer 6 is provided on the upper surface of the wafer stage 7 (on the substrate stage). The auxiliary member 9 suppresses the flow of the liquid 18 from the wafer 6 to the outside, and further suppresses the flow of the liquid 18 from the wafer stage 7 to the base 8, when exposing the edge of the wafer 6.

Moreover, an exposure apparatus, not only of the liquid immersion type but also different types, must be overlaid with the patterns of the reticle with a high accuracy of about several nanometers. In order to perform the overlaying with high accuracy, a plurality of measuring plates 24 is provided on the wafer stage, which serves as a measuring member for performing various measurements related to the exposure such as for focusing or alignment. In a liquid immersion exposure apparatus, the measuring plates 24 are arranged so as to be substantially in the same plane as that of the wafer 6, in a manner similar to the auxiliary member 9. Further, a light sensor 25 for measuring illuminance of the exposure light is arranged on the wafer stage 7 so as to be substantially in the same plane as that of the wafer 6, in a manner similar to the measuring plates 24.

Figure 3A:
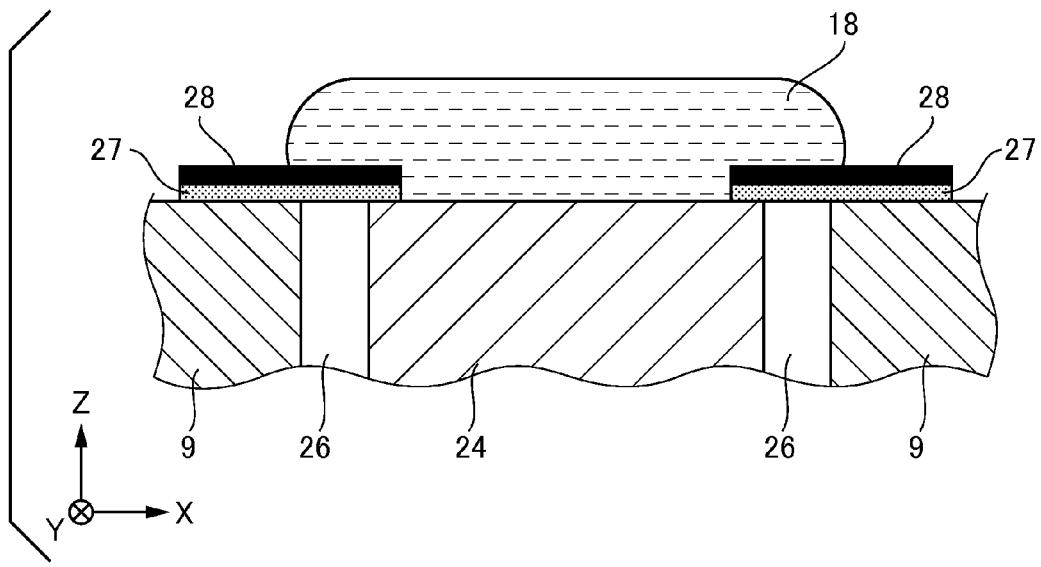
FIG. 3A illustrates a configuration in the vicinity of a measuring plate according to a comparative example.
Figure 3B:
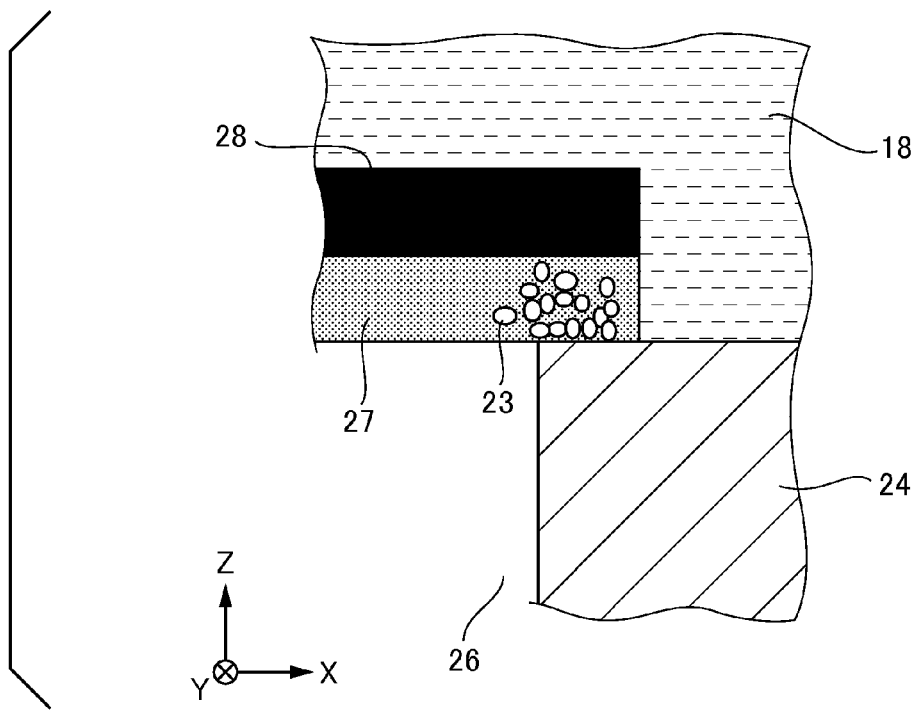
FIG. 3B is an enlarged view of a sealing member in a measuring plate of the comparative example shown in FIG. 3A.

FIG. 3A and FIG. 3B are schematic block diagrams in the vicinity of the measuring plate 24 that are comparative examples not performing the present invention. It is noted that the same reference numerals are provided to each of the elements of the comparative example corresponding to each of the elements of the present embodiment to simplify the description. As shown in FIG. 3A, when the auxiliary member 9 and the measuring plate 24 contact, the power is transmitted via the contact portion, thereby the measuring plate 24 is deformed and displaced, and the measuring accuracy decreases, so that a gap (gap space) 26 is provided between the auxiliary member 9 and the measuring plate 24. The gap 26 is shielded by a sealing member so as not to cause the liquid 18 to flow into the gap 26. The sealing member in the comparative examples has a water-repellent part 28 for suppressing the penetration of the liquid 18 into the gap 26 and an adhesive layer 27 for adhering the water-repellent part 28 to the auxiliary member 9. Optional adhesive or gluing agents may be employed, which serve as the adhesive layer 27, and fluorine compounds (for example, polytetrafluoroethylene such as PTFE or PFA) may be employed, which serve as the water-repellent part 28.

FIG. 3B is an enlarged schematic block diagram of the sealing member in the comparative example. As shown in FIG. 3B, in the adhesive layers 27 of the sealing member in the comparative example, in particular, the micro gaps 23 are readily present on the surface contacting with the measuring plate 24. Because the micro gaps 23 are filled with air, the air in the micro gaps 23 dissolves into the liquid 18 when the deaerated liquid 18 contacts the air. When all the air in the micro gaps 23 dissolves into the liquid 18, the micro gaps 23 acquire a negative pressure to take in the contacting liquid 18. In the case where a plurality of the micro gaps 23 are connected, the penetration of the liquid 18 into the micro gaps 23 and the dissolution of the air into the micro gaps 23 in the liquid 18 continuously occur, and the liquid 18 is taken into the total range of the connected micro gaps 23. In this way, there is a possibility that the liquid 18 taken into the sealing member outflows in the gap 26. If the liquid 18 penetrates into the micro gaps 23 upon movement of the liquid 18 from the measuring plate 24 according to the movement of the wafer stage 7, it is impossible to recover the liquid 18 in the micro gaps 23. In addition, because a portion of the liquid 18 outside the micro gaps 23 is attracted by the liquid 18 in the micro gap 23 due to intermolecular forces, there are cases in which the liquid 18 remains on the measuring plate 24 after the wafer stage 7 moves. In particular, in the case where the liquid 18 covers the contact surface between the sealing member sealing the whole circumference of the gap 26 and the measuring plate 24, and the intermolecular forces of the liquid 18 that has penetrated into the micro gaps 23 are stronger than the surface tension of the liquid 18, there is a possibility that the liquid 18 will form a film and remain on the measuring plate 24.

Figure 4:
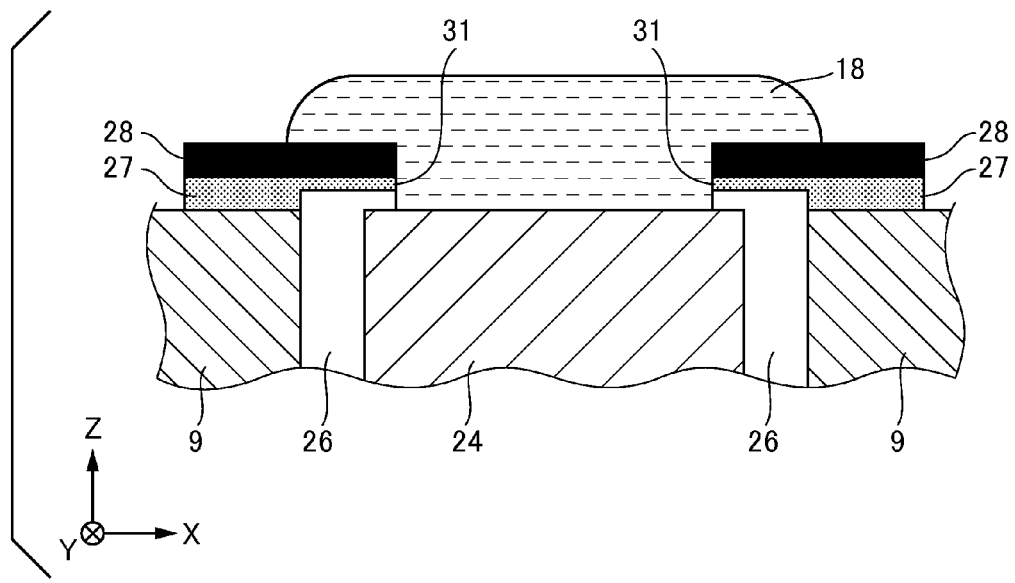
FIG. 4 illustrates a configuration in the vicinity of the measuring plate according to a first embodiment.

Next, a configuration of the sealing member in the present embodiment will be described. FIG. 4 is a schematic block diagram of the vicinity of the measuring plate 24 of the exposure apparatus according to the first embodiment of the present invention. As shown in FIG. 4, an edge 31 on the measuring plate 24 of the adhesive layer (fixing member) 27 in the sealing member of the present embodiment has a cutout structure (first cutout structure) in the form of communicating between the liquid 18 and air in the exposure apparatus so as to release air through the gap 26. According to the configuration, while the liquid 18 is on the surface of the measuring plate 24 and the liquid 18 contacts the edge 31 of the sealing member, a space where a part of the surface of the measuring plate 24 contacts the gas, is formed. As a result, even when the air in the micro gaps in the adhesive layer 27 (corresponding to the micro gaps 23 in FIG. 3B) dissolves in the liquid 18, the micro gaps do not acquire a negative pressure. Therefore, it is possible to suppress the occurrence of the liquid residue due to liquid penetration into the micro gaps of the sealing member and to suppress the reduction of the exposure accuracy and the pollution of the measuring plate. In the present embodiment, the cutout structure is formed in the adhesive layer 27 of the sealing member, but it is possible to have a structure in which the cutout extends to the water-repellent part 28 and communicates with the atmosphere in the gap 26. Moreover, the sealing member in the present embodiment has a two-layered structure consisting of the adhesive layer 27 and the water-repellent part 28, and the adhesive layer 27 is employed, which serves as the fixing member, but the present invention is not limited to this, and the sealing member adhering the water-repellent part 28 by pasting with water may be employed and can obtain a similar effect.

Second Embodiment

Figure 5:
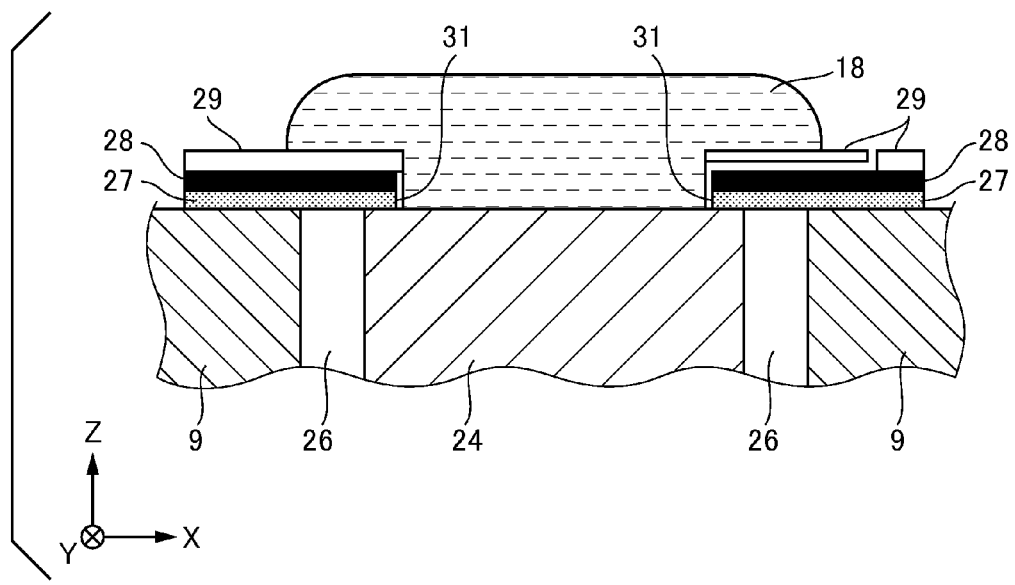
FIG. 5 illustrates a configuration in the vicinity of a measuring plate according to a second embodiment.

Next, an exposure apparatus according to a second embodiment of the present invention will be described. The feature of the exposure apparatus in the present embodiment is to change the cutout structure of the sealing member in the first embodiment and to provide a water-repellent member 29 having the cutout structure on the sealing member. FIG. 5 is a schematic block diagram in the vicinity of a measuring plate 24 according to the second embodiment of the present invention. In FIG. 5, same reference numerals are provided to each of the elements of the same configuration as each of the elements in the vicinity of the measuring plate 24 according to the first embodiment shown in FIG. 4, and the description thereof will be omitted. As shown in FIG. 5, the sealing member according to the present embodiment is provided with the new water-repellent member (first water-repellent member) 29 thereabove (projection optical system 4 side) having water repellency. The water-repellent member 29 is provided so as to extend about 1 to 2 mm more in a central direction of the measuring plate 24 than the water-repellent part 28 and the adhesive layer 27, and has a communicating structure (second cutout structure) provided with a hole for atmosphere releasing outside the liquid 18 by being partially hollowed out. As shown in FIG. 5, the water-repellent member 29 extends in the central direction of the measuring plate 24, and gas from the surface of the auxiliary member 9 passes therethrough to contact the gas and the liquid 18, so that the liquid 18 does not contact with the water-repellent part 28 and the adhesive layer 27. Accordingly, in a manner similar to the first embodiment, it is possible to suppress the occurrence of the liquid residue due to the liquid penetration into the micro gaps of the sealing member and to suppress the reduction of the exposure accuracy and the pollution of the measuring plate.

Third Embodiment

Figure 6:
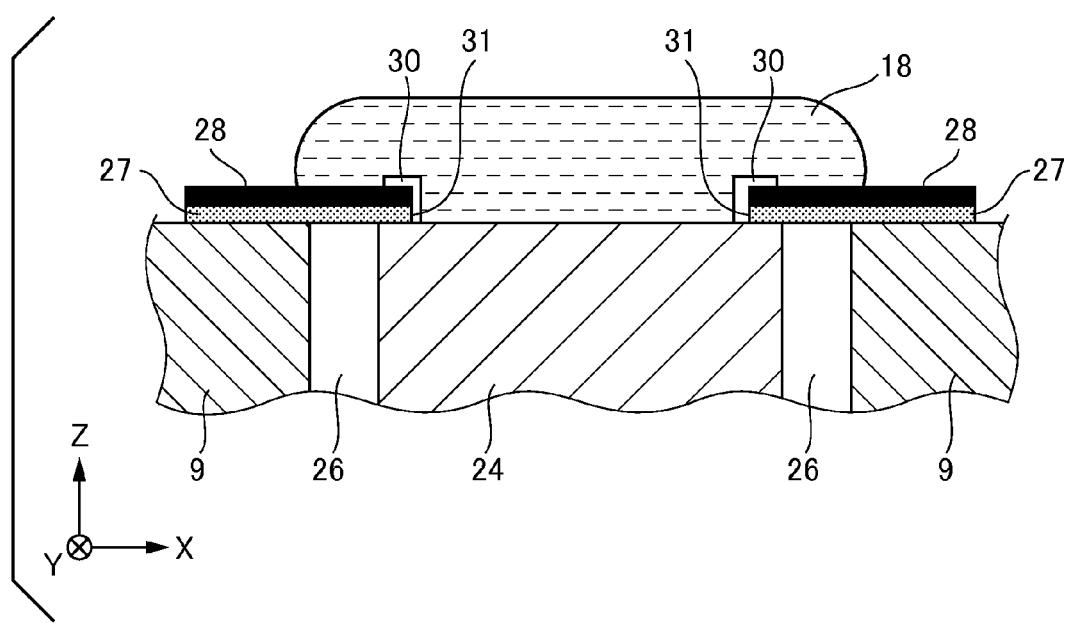
FIG. 6 illustrates a configuration in the vicinity of a measuring plate according to a third embodiment.

Next, an exposure apparatus according to a third embodiment of the present invention will be described. The feature of the exposure apparatus in the present embodiment is to provide a coating film (second water-repellent member) 30 so as to cover the edge 31 of the adhesive layer 27 and the water-repellent part 28 configuring the sealing member, on the measuring plate 24. FIG. 6 is a schematic block diagram in the vicinity of the measuring plate 24 according to the third embodiment of the present invention. In FIG. 6, the same reference numerals are provided to each of the elements of the same configuration as each of the elements in the vicinity of the measuring plate 24 according to the first embodiment shown in FIG. 4, and the description thereof will be omitted. The coating film 30 suppresses permeation of at least one of either liquid or air. The coating film 30 is preferably formed by a water-repellent coating material, but it is possible to employ an adhesive having water-repellency at a receding contact angle of 60 degree or above after curing. According to the configuration, in a manner similar to the first embodiment, the edge 31 of the adhesive layer 27 and the water-repellent part 28 on the measuring plate 24 does not contact the liquid 18. Therefore, it is possible to suppress the occurrence of the liquid residue due to liquid penetration into the micro gap of the sealing member and to suppress the reduction of the exposure accuracy and the pollution of the measuring plate.

(Device Manufacturing Method)

Next, a description will be given of a method for manufacturing a device (semiconductor device, liquid crystal display device, or the like) according to one embodiment of the present invention. The semiconductor device is manufactured by a front-end process in which an integrated circuit is formed on a wafer and a back-end process in which an integrated circuit chip is completed as a product from the integrated circuit on the wafer formed in the front-end process. The front-end process includes a step of exposing a wafer coated with a photosensitizer using the above-described exposure apparatus and a step of developing the exposed wafer. The back-end process includes an assembly step (dicing and bonding) and a packaging step (sealing). The liquid crystal display device is manufactured by a process in which a transparent electrode is formed. The process of forming a transparent electrode includes a step of applying a photosensitizer to a glass substrate on which a transparent conductive film is deposited, a step of exposing the glass substrate coated with the photosensitizer using the above-described exposure apparatus, and a step of developing the exposed glass substrate. According to the device manufacturing method of the present embodiment, a device having a higher quality than that of the conventional device may be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-245600 filed Nov. 28, 2013, which is hereby incorporated by reference herein in its entirety.

What is claimed is:

1. An exposure apparatus that exposes a substrate while liquid is filled between a projection optical system and the substrate, the exposure apparatus comprising:
   a measuring member disposed in a substrate stage for holding the substrate, at a side of a surface holding the substrate of the substrate stage;
   an auxiliary member disposed at a side of the surface of the substrate stage, with a gap between the auxiliary member and the measuring member; and
   a sealing member contacting a surface of the auxiliary member, disposed to cover the gap, and for suppressing penetration of the liquid located on a surface of the measuring member or the surface of the auxiliary member into the gap,
   wherein the sealing member includes a fixing member adhered to the surface of the auxiliary member, and a shape at an edge of the sealing member in a measuring member side forms a space that contacts a part of the fixing member and the liquid with gas, while the liquid is on the surface of the measuring member and the liquid contacts the edge.

2. The exposure apparatus according to claim 1, wherein the sealing member includes a first cutout structure communicated from the edge to the gap.

3. The exposure apparatus according to claim 1, wherein the sealing member further includes a water-repellent part on the surface contacting the liquid, and the water-repellent part includes a second cutout structure for passing the gas from the surface side of the auxiliary member.

4. An exposure apparatus that exposes a substrate while liquid is filled between a projection optical system and the substrate, the exposure apparatus comprising:
   a measuring member disposed in a substrate stage for holding the substrate, at a side of a surface holding the substrate of the substrate stage;
   an auxiliary member disposed at a side of the surface of the substrate stage, with a gap between the auxiliary member and the measuring member; and
   a sealing member contacting a surface of the auxiliary member, disposed to cover the gap, and for suppressing penetration of the liquid located on a surface of the measuring member or the surface of the auxiliary member into the gap,
   wherein the sealing member includes
   a fixing member adhered to the surface of the measuring member, and
   a water-repellent part disposed so as to cover an edge of the fixing member in the measuring member side.

5. The exposure apparatus according to claim 4, wherein the water-repellent part is an adhesive having a receding contact angle of 60 degrees, or above.

6. The exposure apparatus according to claim 1, wherein the measuring member is a measuring plate for measuring position, or a light sensor for measuring illuminance of exposure light.

7. A device manufacturing method comprising:
exposing a substrate using an exposure apparatus that exposes a substrate while liquid is filled between a projection optical system and the substrate, the exposure apparatus comprising:
a measuring member disposed in a substrate stage for holding the substrate, at a side of a surface holding the substrate of the substrate stage;
an auxiliary member disposed at a side of the surface of the substrate stage, with a gap between the auxiliary member and the measuring member; and
a sealing member contacting a surface of the auxiliary member, disposed to cover the gap, and for suppressing penetration of the liquid located on a surface of the measuring member or the surface of the auxiliary member into the gap,
wherein the sealing member includes a fixing member adhered to the surface of the auxiliary member, and a shape at an edge of the sealing member in a measuring member side forms a space that contacts a part of the fixing member and the liquid with gas while the liquid is on the surface of the measuring member and the liquid contacts the edge; and
developing the exposed substrate.

8. A device manufacturing method comprising:
exposing a substrate using an exposure apparatus that exposes a substrate while liquid is filled between a projection optical system and the substrate, the exposure apparatus comprising:
a measuring member disposed in a substrate stage for holding the substrate, at a side of a surface holding the substrate of the substrate stage;
an auxiliary member disposed at a side of the surface of the substrate stage, with a gap between the auxiliary member and the measuring member; and
a sealing member contacting a surface of the auxiliary member, disposed to cover the gap, and for suppressing penetration of the liquid located on a surface of the measuring member or the surface of the auxiliary member into the gap,
wherein the sealing member includes
a fixing member adhered to the surface of the measuring member, and
a water-repellent part disposed so as to cover an edge of the fixing member in the measuring member side; and
developing the exposed substrate.

* * * * *